US008829672B2

(12) United States Patent
Chen et al.

(10) Patent No.: US 8,829,672 B2
(45) Date of Patent: Sep. 9, 2014

(54) SEMICONDUCTOR PACKAGE, PACKAGE STRUCTURE AND FABRICATION METHOD THEREOF

(75) Inventors: Yan-Heng Chen, Taichung (TW); Jung-Pang Huang, Taichung (TW); Hsin-Yi Liao, Taichung (TW); Shih-Kuang Chiu, Taichung (TW); Guang-Hwa Ma, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/563,052

(22) Filed: Jul. 31, 2012

(65) Prior Publication Data
US 2013/0256875 A1   Oct. 3, 2013

(30) Foreign Application Priority Data
Apr. 2, 2012  (TW) .............................. 101111658 A

(51) Int. Cl.
*H01L 21/56* (2006.01)
*H01L 23/48* (2006.01)
*H01L 21/02* (2006.01)
*H01L 21/50* (2006.01)
*H01L 21/60* (2006.01)
*H01L 29/84* (2006.01)
*H01L 23/34* (2006.01)

(52) U.S. Cl.
USPC ........... 257/737; 257/723; 257/686; 257/698; 257/415; 257/778; 438/51; 438/108; 438/199; 438/124

(58) Field of Classification Search
CPC ................. H01L 2227/97; H01L 2924/15311; H01L 2224/18; H01L 2224/82; H01L 23/5389; H01L 2924/00; H01L 2224/48227; H01L 2224/32225; H01L 2224/73204; H01L 2224/16225; H01L 2924/00012; H01L 24/19; H01L 21/823842
USPC ......... 257/737, 723, 686, 698, 778, 415, 738, 257/704, 774, 783; 438/109, 110, 51, 108, 438/199, 124, 275, 127; 361/761, 762
See application file for complete search history.

(56) References Cited

U.S. PATENT DOCUMENTS

| 7,198,980 | B2 * | 4/2007 | Jiang et al. ..................... 438/107 |
| 8,018,068 | B1 | 9/2011 | Scanlan et al. |
| 8,247,893 | B2 * | 8/2012 | Kim et al. ....................... 257/686 |
| 8,263,435 | B2 * | 9/2012 | Choi et al. ..................... 438/109 |
| 8,299,633 | B2 * | 10/2012 | Su ................................. 257/798 |

(Continued)

*Primary Examiner* — Shaun Campbell
*Assistant Examiner* — Thai T Vuong
(74) *Attorney, Agent, or Firm* — Edwards Wildman Palmer LLP; Peter F. Corless; Steven M. Jensen

(57) ABSTRACT

A semiconductor package includes: a dielectric layer having opposite first and second surfaces; a semiconductor chip embedded in the dielectric layer and having a plurality of electrode pads; a plurality of first metal posts disposed on the electrode pads of the semiconductor chip, respectively, such that top ends of the first metal posts are exposed from the first surface; at least a second metal post penetrating the dielectric layer such that two opposite ends of the second metal post are exposed from the first and second surfaces, respectively; a first circuit layer formed on the first surface for electrically connecting the first and second metal posts; and a second circuit layer formed on the second surface for electrically connecting the second metal post. The semiconductor package dispenses with conventional laser ablation and electroplating processes for forming conductive posts in a molding compound, thereby saving fabrication time and cost.

14 Claims, 3 Drawing Sheets

(56) References Cited

U.S. PATENT DOCUMENTS

| | | | |
|---|---|---|---|
| 8,341,835 B1 * | 1/2013 | Huemoeller et al. | 29/841 |
| 8,472,190 B2 * | 6/2013 | Refai-Ahmed et al. | 361/704 |
| 8,476,111 B2 * | 7/2013 | Cho et al. | 438/109 |
| 8,482,134 B1 * | 7/2013 | Darveaux et al. | 257/780 |
| 8,624,370 B2 * | 1/2014 | Chi et al. | 257/678 |
| 8,653,674 B1 * | 2/2014 | Darveaux et al. | 257/786 |
| 8,691,626 B2 * | 4/2014 | Su et al. | 438/108 |
| 2004/0178495 A1 * | 9/2004 | Yean et al. | 257/723 |
| 2005/0046002 A1 * | 3/2005 | Lee et al. | 257/678 |
| 2010/0134991 A1 * | 6/2010 | Kim et al. | 361/762 |

* cited by examiner

US 8,829,672 B2

SEMICONDUCTOR PACKAGE, PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 101111658, filed Apr. 2, 2012, the entire contents of which is incorporated herein by reference.

BACKGROUND OF THE INVENTION

1. Field of the Invention

The present invention relates to semiconductor packages, package structures and fabrication methods thereof, and, more particularly, to a semiconductor package, a package structure and a fabrication method thereof that dispense with a laser ablation process for forming through mold vias in a molding compound.

2. Description of Related Art

Currently, electronic products are developed towards miniaturization, multi-function, high performance and high operation speed. To meet the requirements of the electronic products, a plurality of semiconductor chips or packages are usually integrated in a semiconductor device.

Generally, the number or size of the semiconductor chips in a semiconductor package should be increased so as to improve the overall performance and operation speed. On the other hand, the number and size of the semiconductor chips are limited by the size of substrates on which the semiconductor chips are mounted. Therefore, a package structure having a plurality of semiconductor packages stacked on one another is developed.

In a package structure as disclosed by U.S. Pat. No. 8,018,068, a plurality of through mold vias (TMV) are formed in a molding compound of a semiconductor package through laser ablation, and a plurality of conductive posts are formed in the TMVs through electroplating so as to connect the semiconductor package and another package stacked thereon. However, the laser ablation process for forming the TMVs in the molding compound and the electroplating process for forming the conductive posts in the TMVs increase the fabrication time and cost.

Therefore, there is a need to provide a semiconductor package, a package structure and a fabrication method thereof so as to dispense with the laser ablation process for forming TMVs in a molding compound and the electroplating process for forming conductive posts in the TMVs.

SUMMARY OF THE INVENTION

In view of the above-described drawbacks, the present invention provides a semiconductor package, which comprises: a dielectric layer having opposite first and second surfaces; at least a semiconductor chip embedded in the dielectric layer and having a plurality of electrode pads; a plurality of first metal posts disposed on the electrode pads of the semiconductor chip, respectively, such that top ends of the first metal posts are exposed from the first surface of the dielectric layer; at least a second metal post penetrating the dielectric layer such that two opposite ends of the second metal post are exposed from the first and second surfaces of the dielectric layer, respectively; a first circuit layer formed on the first surface of the dielectric layer for electrically connecting the first and second metal posts; and a second circuit layer formed on the second surface of the dielectric layer for electrically connecting the second metal post.

The present invention further provides a fabrication method of a semiconductor package, which comprises the steps of: providing a carrier having an adhesive layer; mounting at least a semiconductor chip and at least a sheet body on the adhesive layer of the carrier, the semiconductor chip having an active surface with a plurality of electrode pads and a non-active surface opposite to the active surface and the semiconductor chip is mounted on the adhesive layer via the non-active surface thereof, forming a plurality of first metal posts on the electrode pads of the semiconductor chip, respectively, and forming at least a second metal post on the sheet body; forming a dielectric layer on the adhesive layer for encapsulating the semiconductor chip, the sheet body, the first metal posts and the second metal post; removing the adhesive layer and the carrier so as to expose a bottom surface of the dielectric layer; grinding the bottom surface of the dielectric layer to remove the sheet body, a portion of the semiconductor chip and a portion of the dielectric layer so as to expose the second metal post, and grinding an opposite top surface of the dielectric layer to remove a portion of the dielectric layer so as to expose top ends of the first and second metal posts; and forming a first circuit layer on the top surface of the dielectric layer for electrically connecting the first and second metal posts, and forming a second circuit layer on the bottom surface of the dielectric layer for electrically connecting the second metal post.

The present invention further provides a package structure, which comprises: a first semiconductor package; an electronic element stacked on the first semiconductor package; and a plurality of conductive elements disposed between the first semiconductor package and the electronic element for electrically connecting the first semiconductor package and the electronic element. In an embodiment, the first semiconductor package comprises: a dielectric layer having opposite first and second surfaces; at least a semiconductor chip embedded in the dielectric layer and having a plurality of electrode pads; a plurality of first metal posts disposed on the electrode pads of the semiconductor chip, respectively, such that top ends of the first metal posts are exposed from the first surface of the dielectric layer; at least a second metal post penetrating the dielectric layer such that two opposite ends of the second metal post are exposed from the first and second surfaces of the dielectric layer, respectively; a first circuit layer formed on the first surface of the dielectric layer for electrically connecting the first and second metal posts; and a second circuit layer formed on the second surface of the dielectric layer for electrically connecting the second metal post.

The present invention further provides a fabrication method of a package structure, which comprises the steps of: providing a first semiconductor package; and stacking an electronic element on the first semiconductor package and electrically connecting the electronic element and the first semiconductor package through a plurality of conductive elements formed therebetween. In an embodiment, the first semiconductor package comprises: a dielectric layer having opposite first and second surfaces; at least a semiconductor chip embedded in the dielectric layer and having a plurality of electrode pads; a plurality of first metal posts disposed on the electrode pads of the semiconductor chip, respectively, such that top ends of the first metal posts are exposed from the first surface of the dielectric layer; at least a second metal post penetrating the dielectric layer such that two opposite ends of the second metal post are exposed from the first and second surfaces of the dielectric layer, respectively; a first circuit layer formed on the first surface of the dielectric layer for electrically connecting the first and second metal posts; and a second circuit layer formed on the second surface of the dielectric layer for electrically connecting the second metal post.

The present invention further provides a fabrication method of a semiconductor package, which comprises the steps of: mounting at least a semiconductor chip and at least a sheet body on a carrier, the semiconductor chip having a plurality of electrode pads, forming a plurality of first metal posts on the electrode pads of the semiconductor chip, respectively, and forming at least a second metal post on the sheet body; forming a dielectric layer on the carrier for encapsulating the semiconductor chip, the sheet body, the first metal posts and the second metal post, the dielectric layer having a first surface close to the first metal posts and a second surface opposite to the first surface; removing the carrier; grinding the first surface of the dielectric layer to remove a portion of the dielectric layer so as to expose top ends of the first and second metal posts, and grinding the second surface of the dielectric layer to remove the sheet body, a portion of the semiconductor chip and a portion of the dielectric layer so as to expose the second metal post; and forming a first circuit layer on the first surface of the dielectric layer for electrically connecting the first and second metal posts, and forming a second circuit layer on the second surface of the dielectric layer for electrically connecting the second metal post.

According to the present invention, at least a semiconductor chip and at least a sheet body are mounted on a carrier, and a plurality of metal posts are formed on the semiconductor chip and the sheet body, respectively. Then, a dielectric layer is formed to encapsulate the metal posts, the semiconductor chip and the sheet body. Subsequently, the carrier is removed, and top and bottom surfaces of the dielectric layer are ground to expose two opposite ends of the metal posts. As such, the present invention obtains a stackable semiconductor package without the need to perform a laser ablation process for forming through mold vias in a molding compound and an electroplating process for forming conductive posts in the through mold vias as in the prior art, thus effectively saving fabrication time and cost and increasing product competitiveness.

BRIEF DESCRIPTION OF DRAWINGS

FIGS. 2A and 2B are schematic cross-sectional views showing a package structure according to a second embodiment of the present invention, wherein FIG. 2B shows another embodiment of FIG. 2A.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'top', 'end', 'side', 'on', 'a' etc. are only used as a matter of descriptive convenience and not intended to have any other significance or provide limitations for the present invention.

FIGS. 1A to 1I are schematic cross-sectional views showing a semiconductor package, a package structure and a fabrication method thereof according to a first embodiment of the present invention.

Figure 1A:
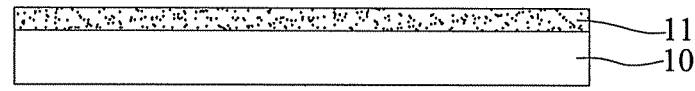
FIGS. 1A to 1I are schematic cross-sectional views showing a semiconductor package, a package structure and a fabrication method thereof according to a first embodiment of the present invention.

Referring to FIG. 1A, an adhesive layer 11 is formed on a carrier 10. The adhesive layer 11 is a releasable adhesive tape, for example, an adhesive tape that loses its adhesive property when heated or exposed to UV light.

Figure 1B:
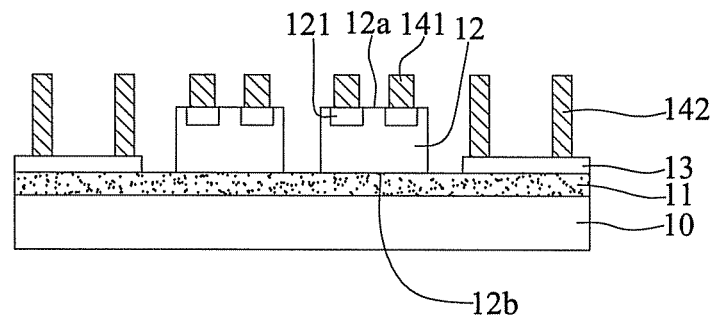

Referring to FIG. 1B, at least a semiconductor chip 12 such as a daisy chain chip and at least a sheet body 13 such as a dummy chip are mounted on the adhesive layer 11. The semiconductor chip 12 has an active surface 12a with a plurality of electrode pads 121 and a non-active surface 12b opposite to the active surface 12, and the semiconductor chip 12 is mounted on the adhesive layer 11 via the non-active surface 12b thereof. A plurality of first metal posts 141 are formed on the electrode pads 121 of the semiconductor chip 12 and a plurality of second metal posts 142 are formed on the sheet body 13, and top ends of the first and second metal posts 141, 142 are flush with each other. The first and second metal posts 141, 142 are made of copper.

Figure 1C:
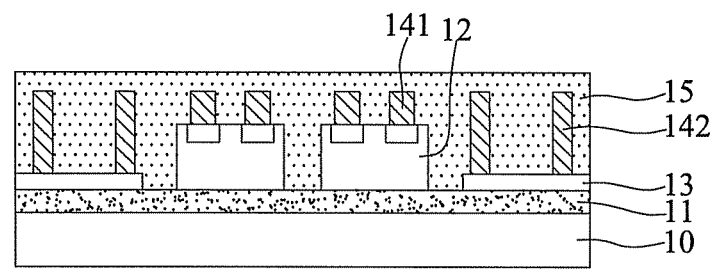

Referring to FIG. 1C, a dielectric layer 15 is formed on the adhesive layer 11 for encapsulating the semiconductor chip 12, the sheet body 13, the first metal posts 141 and the second metal posts 142. The dielectric layer 15 can be a molding compound, a coated polymer or a laminated polymer film. The dielectric layer 15 can be made of ABF (Ajinomoto Build-up Film), BCB (Benzocyclobutene), LCP (Liquid Crystal Polymer), PI (Polyimide), PPE (Polyphenylene ether), PTFE (Polytetrafluoroethylene), FR4, FR5, BT (Bismaleimide Triazine), aramide, or a mixture of epoxy resin and glass fiber.

Figure 1D:
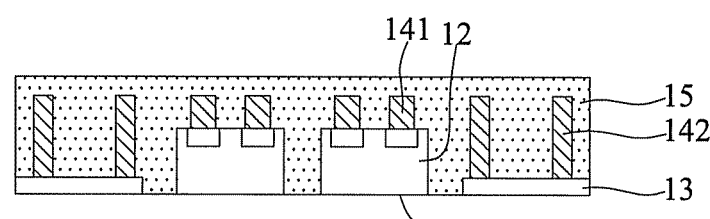

Referring to FIG. 1D, the adhesive layer 11 and the carrier 10 are removed to expose a bottom surface of the dielectric layer 15.

Figure 1E:
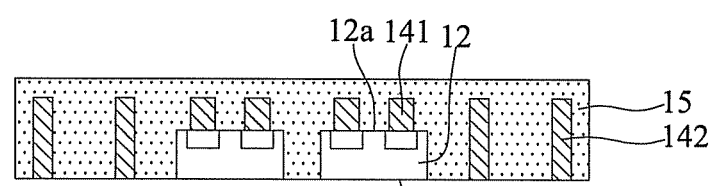

Referring to FIG. 1E, a grinding process is performed from the bottom surface of the dielectric layer 15 so as to remove the sheet body 13, a portion of the semiconductor chip 12 and a portion of the dielectric layer 15, thereby exposing the second metal posts 142 and the non-active surface 12b of the semiconductor chip 12.

Figure 1F:
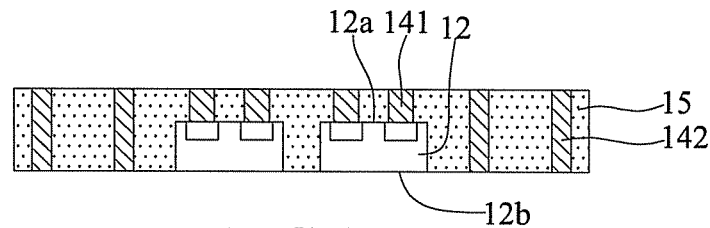

Referring to FIG. 1F, a grinding process is performed from the opposite top surface of the dielectric layer 15 so as to remove a portion of the dielectric layer 15, thereby exposing the top ends of the first metal posts 141 and the second metal posts 142.

Figure 1G:
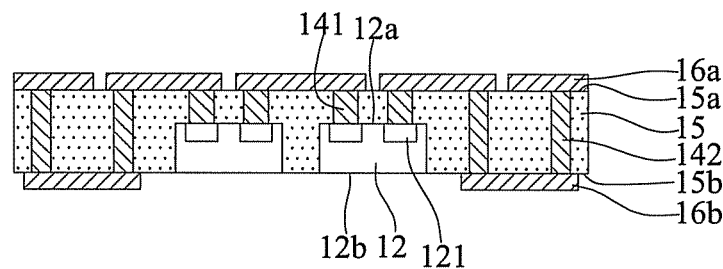

Referring to FIG. 1G a first circuit layer 16a is formed on a first surface 15a (i.e., the top surface) of the dielectric layer 15 for electrically connecting the first and second metal posts 141, 142, and a second circuit layer 16b is formed on a second surface 15b (i.e., the bottom surface) of the dielectric layer 15 for electrically connecting the second metal posts 142. As such, a first semiconductor package is obtained.

Figure 1H:
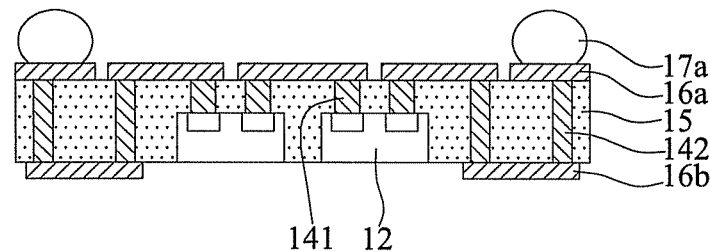

Referring to FIG. 1H, a plurality of conductive elements 17a such as solder balls are formed on the first circuit layer 16a.

Figure 1I:
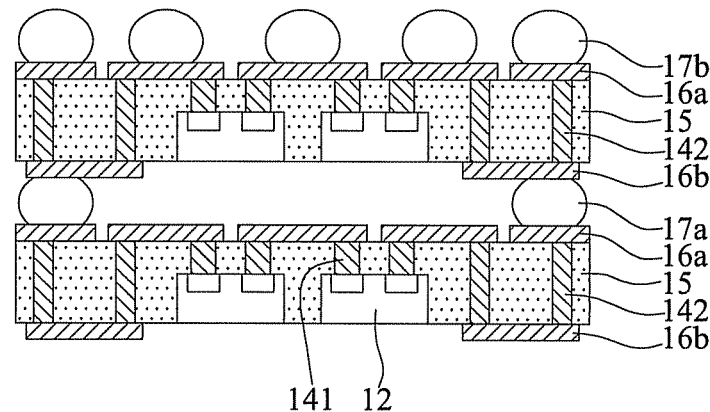

Referring to FIG. 1I, a second semiconductor package is stacked on the conductive elements 17a such that the first circuit layer 16a of the first semiconductor package and the second circuit layer 16b of the second semiconductor package are electrically connected through the conductive elements 17a, thereby obtaining a stack-type package structure. Further, a plurality of conductive elements 17b such as solder balls can be formed on the first circuit layer 16a of the second semiconductor package for stacking other electronic devices (not shown).

Figure 2A:
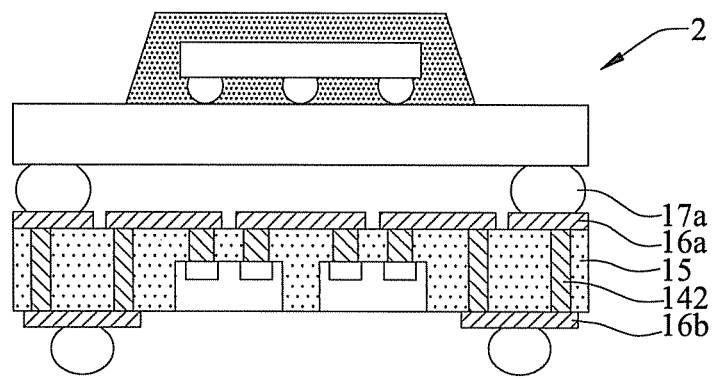
Figure 2B:
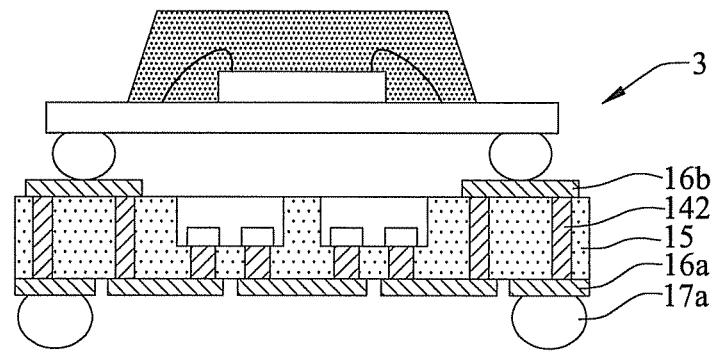

FIGS. 2A and 2B are schematic cross-sectional views showing a package structure according to a second embodiment of the present invention. FIG. 2B shows another embodiment of FIG. 2A.

The second embodiment differs from the first embodiment in that a general semiconductor package is stacked on the first semiconductor package. Referring to FIG. 2A, a flip-chip semiconductor package 2 is stacked on the first semiconductor package and the second circuit layer 16b is used for electrically connecting a circuit board (not shown). Alternatively, referring to FIG. 2B, a wire bonding semiconductor package 3 is stacked on the first semiconductor package and the first circuit layer 16a is used for electrically connecting a circuit board (not shown). The present invention is not limited FIGS. 2A and 2B. For example, a chip-embedded semiconductor package (not shown) can be stacked on the first semiconductor package.

The present invention further provides a semiconductor package, which has: a dielectric layer 15 having opposite first and second surfaces 15a, 15b; at least a semiconductor chip 12 embedded in the dielectric layer 15 and having a plurality of electrode pads 121; a plurality of first metal posts 141 disposed on the electrode pads 121, respectively, such that top ends of the first metal posts 141 are exposed from the first surface 15a of the dielectric layer 15; at least a second metal post 142 penetrating the dielectric layer 15 such that two opposite ends of the second metal post 142 are exposed from the first and second surfaces 15a, 15b of the dielectric layer 15, respectively; a first circuit layer 16a formed on the first surface 15a of the dielectric layer 15 for electrically connecting the first and second metal posts 141, 142; and a second circuit layer 16b formed on the second surface 15b of the dielectric layer 15 for electrically connecting the second metal post 142.

The present invention further provides a package structure, which has: a first semiconductor package; an electronic element stacked on the first semiconductor package; and a plurality of conductive elements 17a, 17b disposed between the first semiconductor package and the electronic element for electrically connecting the first semiconductor package and the electronic element. The first semiconductor package has: a dielectric layer 15 having opposite first and second surfaces 15a, 15b; at least a semiconductor chip 12 embedded in the dielectric layer 15 and having a plurality of electrode pads 121; a plurality of first metal posts 141 disposed on the electrode pads 121, respectively, such that top ends of the first metal posts 141 are exposed from the first surface 15a of the dielectric layer 15; at least a second metal post 142 penetrating the dielectric layer 15 such that two opposite ends of the second metal post 142 are exposed from the first and second surfaces 15a, 15b of the dielectric layer 15, respectively; a first circuit layer 16a formed on the first surface 15a of the dielectric layer 15 for electrically connecting the first and second metal posts 141, 142; and a second circuit layer 16b formed on the second surface 15b of the dielectric layer 15 for electrically connecting the second metal post 142.

In the above-described package structure, the electronic element can be a semiconductor chip or a second semiconductor package having the same structure as the first semiconductor package. The electronic element can be electrically connected to the first circuit layer 16a or the second circuit layer 16b of the first semiconductor package through the conductive elements.

In the above-described semiconductor package and package structure, the first and second metal posts 141, 142 can be made of copper, and the dielectric layer 15 can be made of ABF (Ajinomoto Build-up Film), BCB (Benzocyclobuthene), LCP (Liquid Crystal Polymer), PI (Polyimide), PPE (Polyphenylene ether), PTFE (Polytetrafluoroethylene), FR4, FR5, BT (Bismaleimide Triazine), aramide, or a mixture of epoxy resin and glass fiber.

In the above-described package structure, the conductive elements 17a can be solder balls.

According to the present invention, at least a semiconductor chip and at least a sheet body are mounted on a carrier, and a plurality of metal posts are formed on the semiconductor chip and the sheet body, respectively. Then, a dielectric layer is formed to encapsulate the metal posts, the semiconductor chip and the sheet body. Subsequently, the carrier is removed, and top and bottom surfaces of the dielectric layer are ground to expose two opposite ends of the metal posts. As such, the present invention obtains a stackable semiconductor package without the need to perform a laser ablation process for forming through mold vias in a molding compound and an electroplating process for forming conductive posts in the through mold vias as in the prior art, thereby effectively saving fabrication time and cost and increasing product competitiveness.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
    a dielectric layer having opposite first and second surfaces;
    at least a semiconductor chip embedded in the dielectric layer and having an active surface with a plurality of electrode pads, and a non-active surface opposite to the active surface and exposed from the second surface of the dielectric layer;
    a plurality of first metal posts disposed on the electrode pads of the semiconductor chip, respectively, such that top ends of the first metal posts are exposed from the first surface of the dielectric layer;
    at least a second metal post penetrating the dielectric layer such that two opposite ends of the second metal post are exposed from the first and second surfaces of the dielectric layer, respectively;
    a first circuit layer formed on the first surface of the dielectric layer for electrically connecting the first and second metal posts; and
    a second circuit layer formed on and projected from the second surface of the dielectric layer for electrically connecting the second circuit layer to the second metal post.

2. The semiconductor package of claim 1, wherein the first and second metal posts are made of copper.

3. A package structure, comprising:
    a first semiconductor package, comprising:
        a dielectric layer having opposite first and second surfaces;
        at least a semiconductor chip embedded in the dielectric layer and having an active surface with a plurality of electrode pads, and a non-active surface opposite to the active surface and exposed from the second surface of the dielectric layer;
        a plurality of first metal posts disposed on the electrode pads of the semiconductor chip, respectively, such that top ends of the first metal posts are exposed from the first surface of the dielectric layer;
        at least a second metal post penetrating the dielectric layer such that two opposite ends of the second metal post are exposed from the first and second surfaces of the dielectric layer, respectively;
a first circuit layer formed on the first surface of the dielectric layer for electrically connecting the first and second metal posts; and
a second circuit layer formed on and projected from the second surface of the dielectric layer for electrically connecting the second circuit layer to the second metal post;
an electronic element stacked on the first semiconductor package; and
a plurality of conductive elements disposed between the first semiconductor package and the electronic element for electrically connecting the first semiconductor package and the electronic element.

4. The package structure of claim 3, wherein the electronic element is a semiconductor chip or a second semiconductor package.

5. The package structure of claim 4, wherein the second semiconductor package comprises:
a dielectric layer having opposite first and second surfaces;
at least a semiconductor chip embedded in the dielectric layer and having a plurality of electrode pads;
a plurality of first metal posts disposed on the electrode pads of the semiconductor chip, respectively, such that top ends of the first metal posts are exposed from the first surface of the dielectric layer;
at least a second metal post penetrating the dielectric layer such that two opposite ends of the second metal post are exposed from the first and second surfaces of the dielectric layer, respectively;
a first circuit layer formed on the first surface of the dielectric layer for electrically connecting the first and second metal posts; and
a second circuit layer formed on the second surface of the dielectric layer for electrically connecting the second circuit layer to the second metal post.

6. The package structure of claim 4, wherein the second semiconductor package is a flip-chip semiconductor package, a chip-embedded semiconductor package or a wire bonding semiconductor package.

7. The package structure of claim 3, wherein the first and second metal posts are made of copper.

8. The package structure of claim 3, wherein the electronic element is electrically connected to the first circuit layer or the second circuit layer through the conductive elements.

9. A fabrication method of a package structure, comprising the steps of:
providing a first semiconductor package comprising:
a dielectric layer having opposite first and second surfaces;
at least a semiconductor chip embedded in the dielectric layer and having an active surface with a plurality of electrode pads, and a non-active surface opposite to the active surface and exposed from the second surface of the dielectric layer;
a plurality of first metal posts disposed on the electrode pads of the semiconductor chip, respectively, such that top ends of the first metal posts are exposed from the first surface of the dielectric layer;
at least a second metal post penetrating the dielectric layer such that two opposite ends of the second metal post are exposed from the first and second surfaces of the dielectric layer, respectively;
a first circuit layer formed on the first surface of the dielectric layer for electrically connecting the first and second metal posts; and
a second circuit layer formed on and projected from the second surface of the dielectric layer for electrically connecting the second circuit layer to the second metal post; and
stacking at least an electronic element on the first semiconductor package and electrically connecting the electronic element and the first semiconductor package through a plurality of conductive elements formed therebetween.

10. The fabrication method of claim 9, wherein the electronic element is a semiconductor chip or a second semiconductor package.

11. The fabrication method of claim 10, wherein the second semiconductor package comprises:
a dielectric layer having opposite first and second surfaces;
at least a semiconductor chip embedded in the dielectric layer and having a plurality of electrode pads;
a plurality of first metal posts disposed on the electrode pads of the semiconductor chip, respectively, such that top ends of the first metal posts are exposed from the first surface of the dielectric layer;
at least a second metal post penetrating the dielectric layer such that two opposite ends of the second metal post are exposed from the first and second surfaces of the dielectric layer, respectively;
a first circuit layer formed on the first surface of the dielectric layer for electrically connecting the first and second metal posts; and
a second circuit layer formed on the second surface of the dielectric layer for electrically connecting the second circuit layer to the second metal post.

12. The fabrication method of claim 10, wherein the second semiconductor package is a flip-chip semiconductor package, a chip-embedded semiconductor package or a wire bonding semiconductor package.

13. The fabrication method of claim 9, wherein the first and second metal posts are made of copper.

14. The fabrication method of claim 9, wherein the electronic element is electrically connected to the first circuit layer or the second circuit layer through the conductive elements.

* * * * *